United States Patent [19]
Fusco et al.

[11] Patent Number: 6,067,652
[45] Date of Patent: May 23, 2000

[54] TESTER-COMPATIBLE TIMING TRANSLATION SYSTEM AND METHOD USING TIME-SET PARTNERING

[75] Inventors: Gene T. Fusco; Duncan W. C. Halstead; Christine H. Whitley, all of Fort Collins, Colo.

[73] Assignee: LSI Logic Corporation, Milpitas, Calif.

[21] Appl. No.: 09/124,494

[22] Filed: Jul. 29, 1998

[51] Int. Cl.[7] .................................................. G01R 31/28
[52] U.S. Cl. .......................................................... 714/741
[58] Field of Search ...................................... 714/741, 744, 714/738, 742, 728, 30

[56] References Cited

U.S. PATENT DOCUMENTS

| | | | |
|---|---|---|---|
| 4,760,377 | 7/1988 | Jackson | 340/347 |
| 5,446,742 | 8/1995 | Vahabi et al. | 714/738 |
| 5,475,624 | 12/1995 | West | 364/578 |
| 5,522,038 | 5/1996 | Lindsay et al. | 714/41 |
| 5,528,604 | 6/1996 | El-Maleh et al. | 714/738 |
| 5,668,745 | 9/1997 | Day | 714/738 X |
| 5,778,004 | 7/1998 | Jennion et al. | 714/724 |
| 5,958,077 | 9/1999 | Banerjee et al. | 714/738 |
| 5,974,241 | 10/1999 | Fusco | 714/30 X |

*Primary Examiner*—Hoa T. Nguyen

[57] ABSTRACT

A system comprises translation software to convert non-tester-compatible simulation results into tester-compatible test patterns in a ATE system. An intermediate output of the system includes tester-compatible input stimulus for use in re-simulating a circuit design. The resulting simulation output data is tester-compatible, by definition, and can be used to generate tester-compatible test patterns that correspond to a verified simulation of the circuit design. Partnered time sets and signal state data are used in translation between tester-compatible and non-tester-compatible timings.

11 Claims, 6 Drawing Sheets

TESTER-COMPATIBLE TIMING TRANSLATION SYSTEM AND METHOD USING TIME-SET PARTNERING

BACKGROUND OF THE INVENTION

1. Field of the Invention

The present invention pertains generally to electrical computers and more particularly to systems and methods of generating data for testing an electrical circuit.

2. Description of Related Art

Microelectronic integrated circuits (ICs), such as computer chips, are used in a variety of products including personal computers, automobiles, communication systems, and consumer electronics products. To produce an IC, a manufacturer must first design an electronic circuit to integrate (i.e., manufacture) into a chip. This stage of the design process typically requires a designer to simulate a circuit description in a circuit simulator and compare the simulated results with expected results to verify the proper operation of the circuit design. A circuit design representation, such as a circuit netlist or a Register Transfer Level (RTL) description, is input into the simulator to provide a description of the circuit to be simulated. A netlist is typically a list of electronic logic cells with a description of the connections between the inputs and the outputs of the various logic cells. An RTL description is a description of the functionality of the circuit, much like programming source code is a description of the functionality of a software program.

To simulate the circuit, the designer must also provide input stimulus to the simulation. Input stimulus represents a set of input signals required to drive specific functional aspects of the circuit during simulation. Generally, the input stimulus used in circuit simulation is created by the designer to simulate and verify the operation of the circuit design embodied in the design representation. The input stimulus is primarily based on anticipated real world conditions (e.g., the conditions of an IC found in a cellular phone) and on requirements for properly exercising particular functional blocks within the circuit.

After a circuit is designed, it is manufactured into an IC by way of a microelectronics fabrication process. Fabrication involves multiple stages of chemical processing to create a physical IC having, for example, solid state transistors, solid state resistors, input/output pads, metal interconnections and so on. Various design, manufacturing, and operational conditions can cause a manufactured IC to perform incorrectly after it has been fabricated. Therefore, an IC manufacturer typically tests the operation of every IC it produces to verify proper operation.

The testing of an IC requires high speed testers, typically called Automated Test Equipment (ATE) systems, that can test hundreds of chips per hour. Like circuit simulators, ATE systems also require input and output information (called "test patterns") to drive the IC and to verify results during testing. However, in contrast to simulators, the high speed requirements and hardware limitations of an ATE system restrict the timings and waveforms of the test patterns. As such, the "real world" timings and waveforms of the simulation's input stimulus cannot always be reproduced on an ATE system. For example, a simulator's input signal may transition from a logical '0' to a logical '1' at a non-integer number of nanoseconds, but on a particular ATE system, input signal transactions may be limited to 5 nanosecond increments. These testing restrictions can also vary depending on the particular ATE system that is to be used during the test. Accordingly, the designer must provide tester-compatible test pattern timings for each input signal so that the test patterns comply with the target ATE system's limitations. Input stimulus and test patterns in which every input signal conforms to the target ATE system's restrictions are termed "tester-compatible," whereas input stimulus and test patterns that do not conform are termed "non-tester-compatible". Generation of test patterns from non-tester-compatible simulation output requires modification of input signal timing to become tester-compatible, but such modifications can introduce changes in the simulated circuit operation or results. In contrast, it is desirable to generate test patterns that are compatible with a particular ATE system and that may be generated from the output of a simulation executed with tester-compatible input stimulus. In this manner, both the simulator input stimulus and the ATE test patterns would be tester compatible, thereby verifying the same circuit operation and results.

Therefore, IC design engineers need a method of generating tester-compatible input stimulus and test patterns from non-tester compatible input stimulus so that the physical device tests on the ATE system are substantially equivalent to the simulated conditions. Furthermore, a translation from non-tester-compatible to tester-compatible may introduce or require changes in the circuit operation or results; therefore, a need exists to conveniently re-simulate the translated input stimulus, so as to obtain simulations and physical tests that verify the same functionality and achieve the same results.

SUMMARY OF THE INVENTION

It is therefore an object of the present invention to provide a system and method for generating tester-compatible test patterns for use in a ATE system.

It is another object of the present invention to provide a system and method for translating non-tester-compatible simulation output into tester-compatible simulation input stimulus, so as to obtain tester-compatible simulation output from a subsequent simulation.

Additional objects, advantages, and novel features of the invention are set forth in the description which follows and will become more apparent to those skilled in the art when taken in conjunction with the accompanying drawings. The objects and advantages of the invention may be realized and attained by means of the instrumentalities and accommodations particularly pointed out in the appended claims.

A method in accordance with the present invention overcomes disadvantages and limitations identified in the related art by allowing re-simulation of the circuit using translated, tester-compatible input stimulus. In this manner, a designer ensures that the test patterns generated therefrom are tester-compatible and correspond to simulated and verified results from an actual simulation. As a result, the generated test patterns are substantially "debugged" using the simulator, which is less expensive and easier than debugging the test patterns on an ATE system.

A system in accordance with the present invention comprises translation software to convert non-tester-compatible-simulation results into tester-compatible test patterns in a ATE system. An intermediate output of the system includes tester-compatible input stimulus for use in re-simulating a circuit design. The resulting simulation output data is tester-compatible, by definition, and can be used to generate tester-compatible test patterns that correspond to a verified simulation of the circuit design.

DETAILED DESCRIPTION OF A PREFERRED EMBODIMENT

Figure 1:
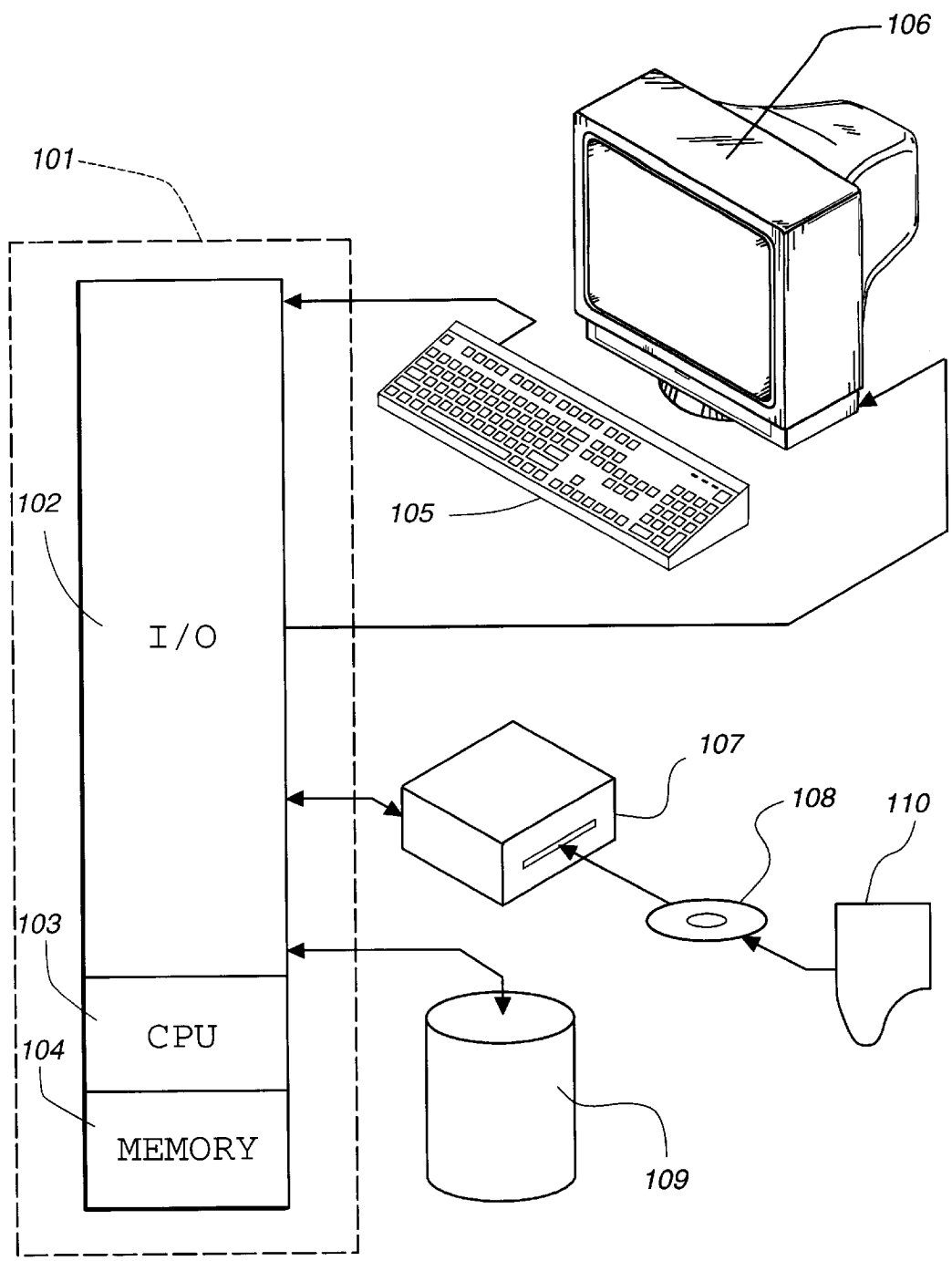
FIG. 1 depicts a general purpose computer in accordance with the present invention.

One operating environment in which the present invention is potentially useful encompasses the general purpose computer. In such a system, data and program files may be input to the computer, which reads the files and executes the programs therein. Some of the elements of a general purpose computer are shown in FIG. 1, wherein a processor 101 is shown having an input/output (I/O) section 102, a Central Processing Unit (CPU) 103, and a memory section 104. The present invention is optionally implemented in software devices loaded in memory 104 and/or stored on a configured CD-ROM 108 or storage unit 109 thereby transforming the computer system in FIG. 1 to a special purpose machine for implementing the present invention.

The I/O section 102 is connected to keyboard 105, display unit 106, disk storage unit 109, and disk drive unit 107. Generally, in contemporary systems, the disk drive unit 107 is a CD-ROM driver unit capable of reading a CD-ROM medium 108, which typically contains programs 110 and data. Computer program products or circuit models containing mechanisms to effectuate the apparatus and methods in accordance with the present invention may reside in the memory section 104, on a disk storage unit 109, or on the CD-ROM medium 108 of such a system. Alternatively, disk drive unit 107 may be replaced by a floppy drive unit, a tape drive unit, or other storage medium drive unit. Examples of such systems include SPARC systems offered by Sun Microsystems, Inc., personal computers offered by IBM Corporation and by other manufacturers of IBM-compatible personal computers, and other systems running a UNIX-based or other operating system. In accordance with the present invention, simulator, verification, translation, and generation modules may be executed by CPU 103, and simulation output, input stimulus, and other data may be stored on disk storage unit 109, disk drive unit 107 or other storage medium drive units coupled to the system.

Figure 2A:
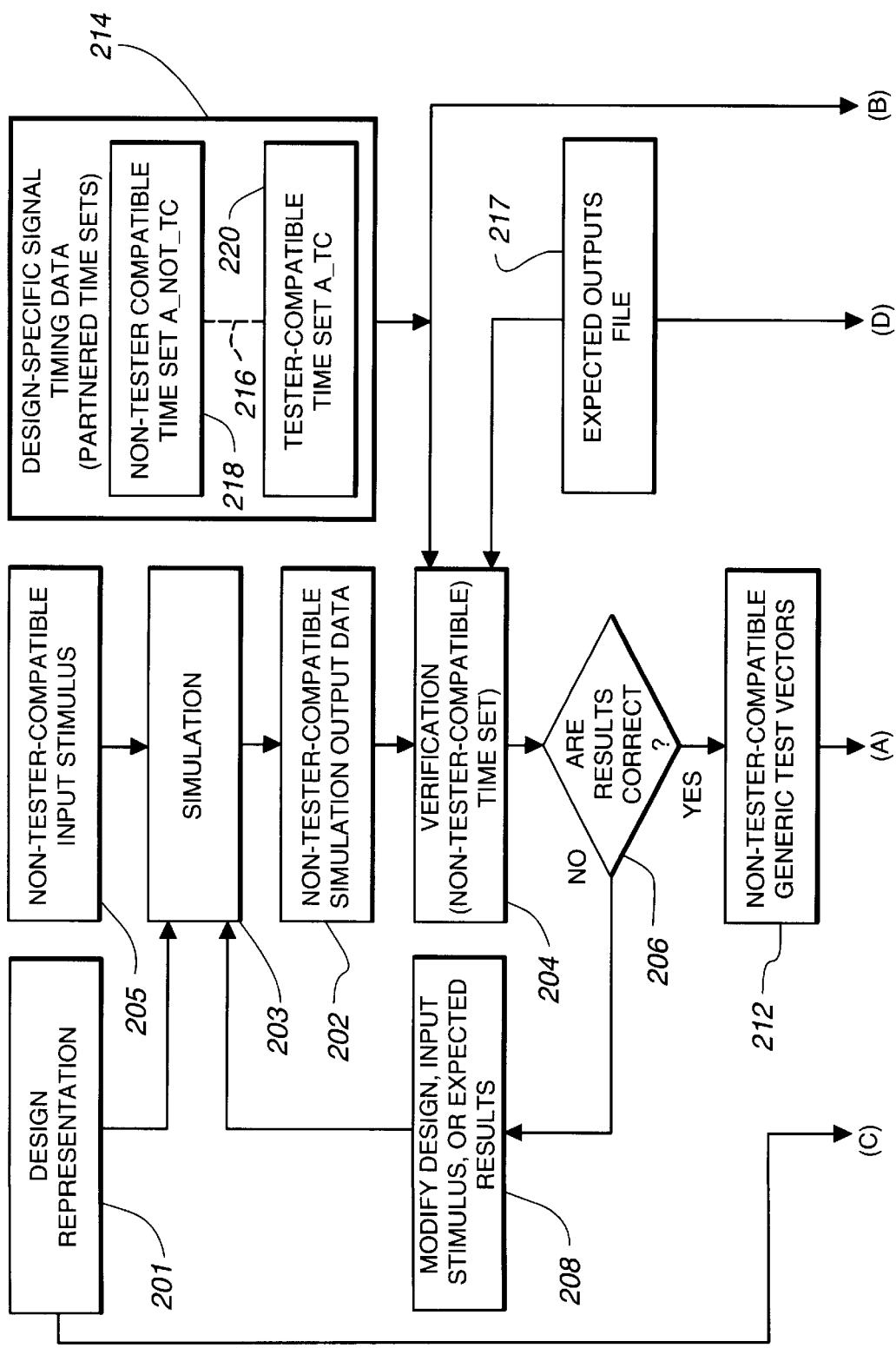
FIGS. 2A and 2B depict a block diagram for generating tester-compatible test patterns in a process starting with non-tester-compatible input stimulus.
Figure 2B:
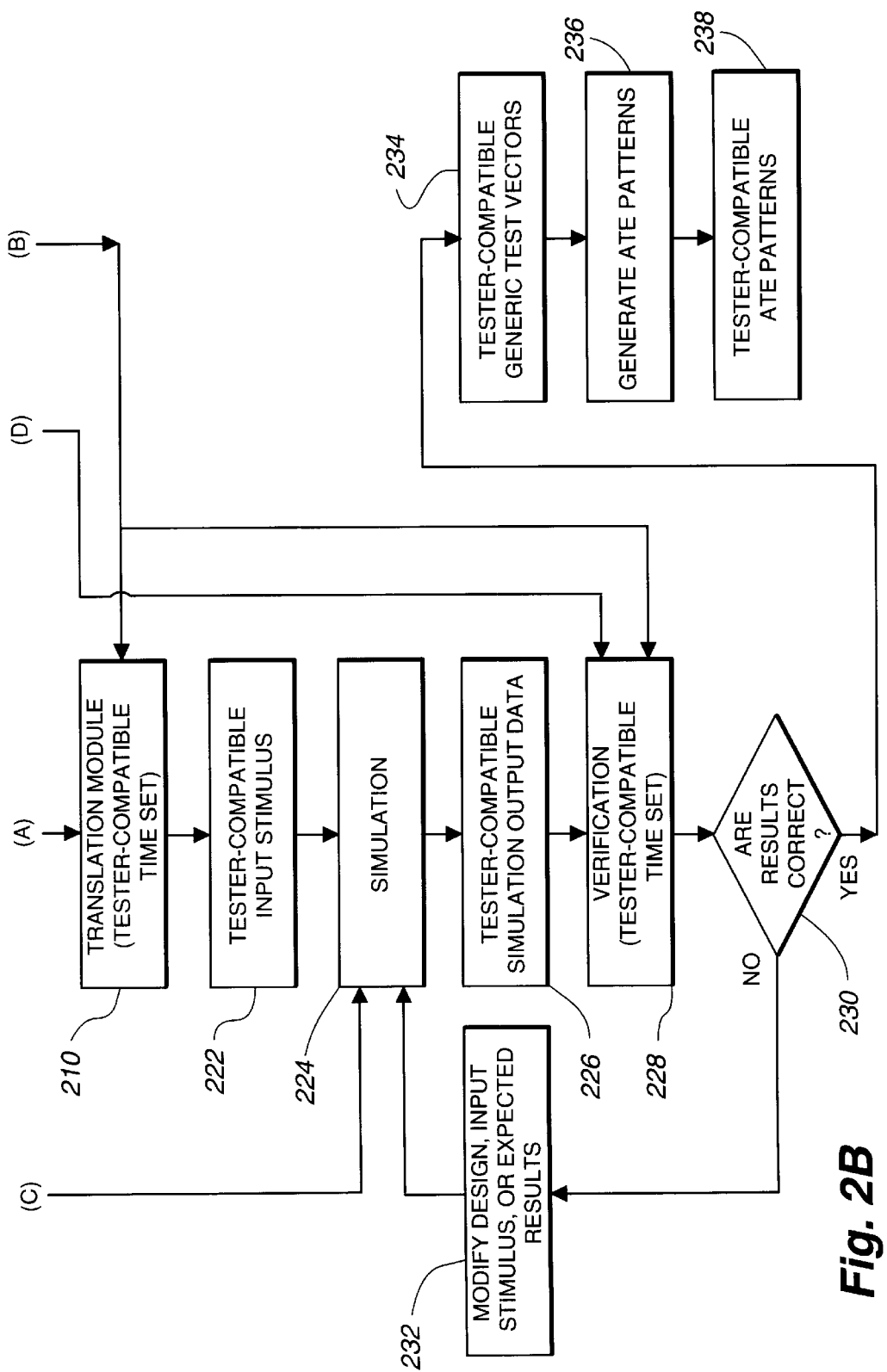

FIG. 2 illustrates a test pattern generation process in accordance with the present invention. Circuit design representation 201, preferably in RTL, netlist, or design database format, is simulated in simulation module 203 to produce a simulation output file 202. Non-compatible input stimulus 205 is input to simulation module 203 to specify the input signals used during the simulation. Input stimulus 205 is in a format required by the particular simulator in simulator module 203. For example, a VERILOG simulator requires that the input stimulus be in a proprietary format specified, for example, in Cadence VERILOG-XL IC 4.42 Simulation Reference Manual. Other input stimulus formats such as VHSIC Hardware Description Language (VHDL) and Verilog Hardware Description Language are also contemplated within the scope of the present invention.

The simulation output file 202 is a "print-on-change" file that includes the timing, state, and strength of input, output, and bi-directional signals operating during the simulation. Input, output, and bi-directional signal descriptions include a time value, indicating the time of a signal change during the simulation, and a state/strength value for each signal in the simulation. The state/strength of a signal, for example, can include a "strong 0" (0—referring to a logical 0), a "strong 1" ("1"—a logical 1), a "strong low" ("L"—low resistive voltage), a "strong high" ("H"—a high resistive voltage), a "strong X" ("X"—an unknown state), or a high-impedance state ("Z"—a tri-stated signal state), although other state/strength values are also contemplated within the scope of this invention. Furthermore, other simulation output file formats are contemplated within the scope of the present invention.

Table 1 shows an example of simulation output file data. Assume that a design has three input signals, I1, I2, and I3, and two output signals, O1, and O2. In a table in the header of each simulation output file, each signal is associated with a column number in the simulation output file (i.e., I1 is associated with column 1, I2 is associated with column 2, etc.). After the header, as shown in Table 1, the states and strengths of each signal at various times during the simulation are listed until the simulation is completed. The first row in the table shows the initial state/strengths of the signals. The second row shows that the I3 signal changed states from an X to a 0 at 3.331 ns into the simulation. The third row shows that the I2 signal changed states from a 0 to a 1 at 3.572 ns into the simulation. The fourth row shows that the O2 signal changed states from a 1 to a 0 at 6.000 ns into the simulation. The times associated with each row are based on the time of a signal state/strength change and are not dependent on a tester or simulator cycle. The data format illustrated in Table 1 is an example of data used in an embodiment of the present invention. Other simulation output data formats are also contemplated in accordance with the present invention.

TABLE 1

| EXAMPLE OF SIMULATION OUTPUT DATA | | | | | | |
|---|---|---|---|---|---|---|
| Time | I1 | I2 | I3 | O1 | O2 | O3 |
| 0.00 ns | 0 | 0 | X | Z | 1 | 1 |
| 3.331 ns | 0 | 0 | 0 | Z | 1 | 1 |
| 3.572 ns | 0 | 1 | 0 | Z | 1 | 1 |
| 6.000 ns | 0 | 1 | 0 | Z | 1 | 0 |

Verification module 204 checks the simulation results to determine whether the design simulates as expected, as compared with a set of expected results provided by the designer from Expected Output file 217. If, as determined in decision block 206, the results are not correct, the designer modifies the design, the input stimulus, and/or the expected results in block 208 and re-simulates the design with the modifications. This process is repeated iteratively until the simulation results satisfy the expected results (provided by the designer in block 217), at which point the process proceeds to translation module 210 with a set of non-tester-compatible generic test vectors 212, which are an output of verification module 204.

Figure 4:
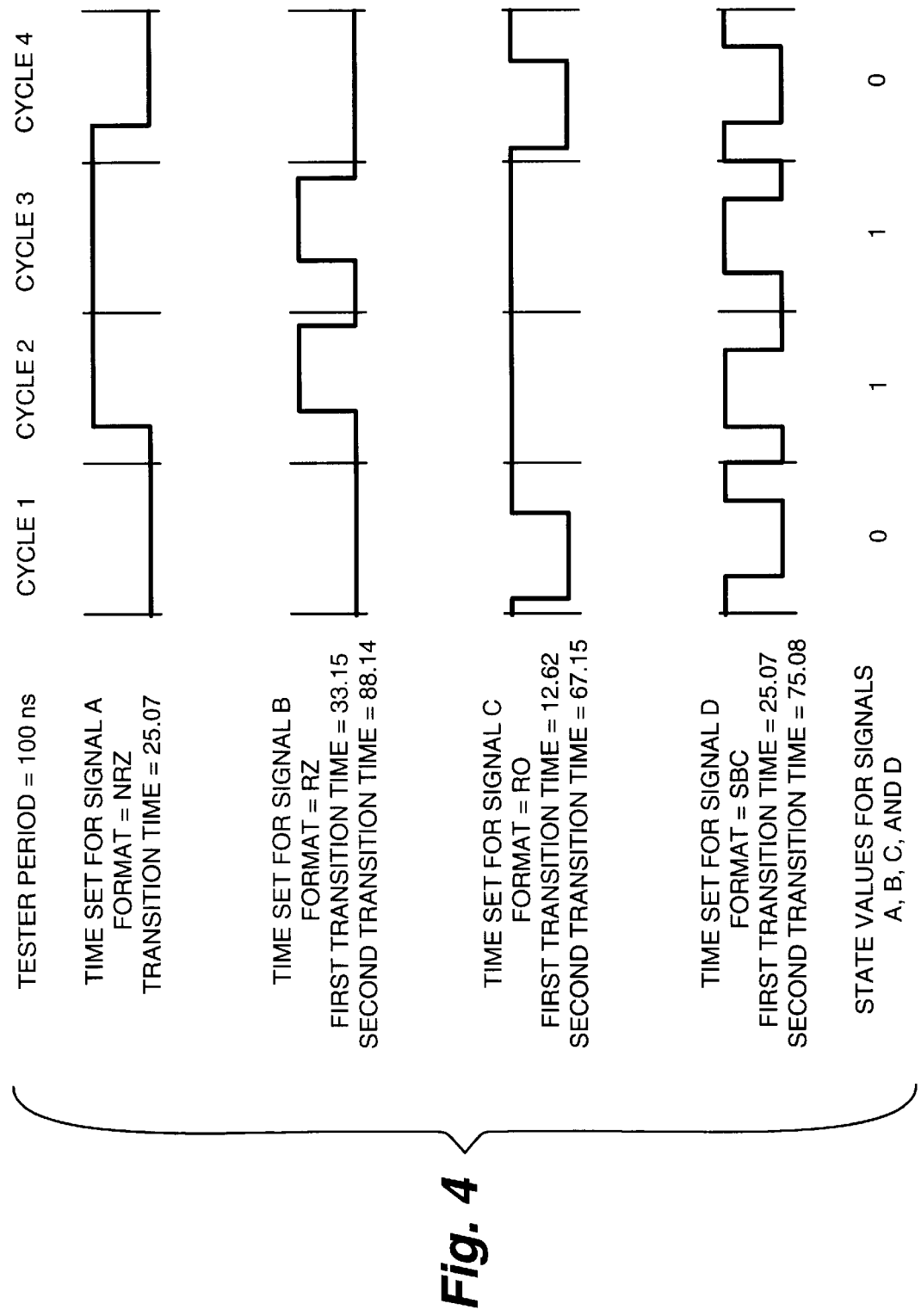
FIG. 4 depicts examples of how waveform formats and transition times are combined with tester cycle and input signal state data values to produce a tester input signal.

Verification module 204 also ensures that the input, output, and bidirectional signal waveform formats are compatible with the targeted ATE system. Each ATE system supports a specific set of waveform formats. Examples of such formats might include Return to Zero (RZ), Return to One (RO), Non-Return to Zero (NRZ), Non-Return to One (NRO), and Surround by Complement (SBC). These waveform formats are known in the art of ATE technology and are further described in Chapter 1 of Reference Manual for Symbios Logic Design Packages—Design Test Release 2.5, incorporated herein by reference. FIG. 4 illustrates examples of combining waveform formats with transition times and input signal state data values to produce input signals for a simulator or test patterns for an ATE system.

Verification module 204 also enforces specific ATE system timing restrictions (e.g., to assure that input signal transitions occur at 5 nanosecond increments) by analyzing timing data (i.e., time set data) provided in design-specific signal timing data file 214. Timing data in design-specific signal timing data file 214 is represented by a time set associated with each input signal in a test cycle. Each time set includes waveform formats and signal transition times for a particular signal or for a group of signals. Each time set is evaluated in combination with the time and state/strength values input from the simulation output file to determine whether the input stimulus used in the simulation is tester-compatible. Regardless of the tester compatibility of the input stimulus, a verification block outputs a generic test vector file reflecting the input signal state changes for each signal, according to the simulation output and the selected time set data.

The generic test vector file is tester-cycle-based, rather than time based, and must be processed in combination with a time set to extract time-based signaling. In a preferred embodiment, generic test vector data includes a table of tester cycles, the state of each signal in the corresponding tester cycle, and a time set indicator used to generate the generic test vector data for the signal. An example of data included in a generic test vector file is depicted in Table 2, although other data formats are contemplated within the scope of the present invention.

TABLE 2

EXAMPLE OF DATA STORED IN A GENERIC TEST VECTOR FILE

| Cycle | Test Vector (I1, O1, B1) | Time Set Indicator |
|---|---|---|
| 1 | 011 | A_NOT_TC |
| 2 | 010 | A_NOT_TC |
| 3 | 000 | A_NOT_TC |
| 4 | 010 | B_NOT_TC |
| 5 | 111 | B_NOT_TC |

In Table 2, a time set is applied to relevant signals in each of the five cycles. Specifically, time set A_NOT_TC is applied to the signals in the first three cycles and time set B_NOT_TC is applied to the signals in the last two cycles. Both time set can be stored in the same design-specific signal timing database, as shown in Table 3.

Table 3 illustrates an example of data to be found in design-specific signal timing data file 214, in accordance with the present invention, and does not illustrate a particular textual or data format required in accordance with this invention. The time set data is provided by the designer or test engineer based on knowledge of the simulation and the target ATE system. Verification modules 204 and 228 and translation module 210 include options (such as command line options or function parameters) to specify the appropriate time set group (tester-compatible or non-tester-compatible) to use in the verification or translation. In an embodiment of the present invention, these modules include command line option "–TCOMP" that specifies that the non-tester-compatible time set (as indicated by the "Tester compatible" value in each time set) should be used, and option "+TCOMP" that specifies that the tester-compatible time set should be used.

TABLE 3

EXAMPLE OF DATA STORED IN A DESIGN-SPECIFIC SIGNAL TIMING DATA FILE

| | |
|---|---|
| Time Set A_NOT_TC | Time Set A_TC |
| Period: 100 | Period: 100 |
| Tester Compatible: NO | Tester Compatible: YES |
| Partner: A_TC | Partner: A_NOT_TC |
| Signal: INPUTA | Signal: INPUTA |
| Format: RZ | Format: RZ |
| Rise Time: 11.8 | Rise Time: 10 |
| Fall Time: 57.6 | Fall Time: 60 |
| Strobe: N/A | Strobe: N/A |
| Signal: OUTPUTA | Signal: OUTPUTA |
| Format: N/A | Format: N/A |
| Rise Time: N/A | Rise Time: N/A |
| Fall Time: N/A | Fall Time: N/A |
| Strobe: 80.7 | Strobe: 85 |
| Signal: BIDIRA | Signal: BIDIRA |
| Format: RO | Format: RO |
| Rise Time: 26.3 | Rise Time: 25 |
| Fall Time: 76.3 | Fall Time: 75 |
| Strobe: 87.7 | Strobe: 90 |
| Time Set B_NOT_TC | Time Set B_TC |
| Period: 100 | Period: 100 |
| Tester Compatible: NO | Tester Compatible: YES |
| Partner: B_TC | Partner: B_NOT_TC |
| Signal: INPUTA | Signal: INPUTA |
| Format: RZ | Format: RZ |
| Rise Time: 21.8 | Rise Time: 20 |
| Fall Time: 50.6 | Fall Time: 50 |
| Signal: OUTPUTA | Signal: OUTPUTA |
| Format: N/A | Format: N/A |
| Rise Time: N/A | Rise Time: N/A |
| Fall Time: N/A | Fall Time: N/A |
| Strobe: 80.7 | Strobe: 85 |
| Signal: BIDIRA | Signal: BIDIRA |
| Format: RO | Format: RO |
| Rise Time: 25.3 | Rise Time: 25 |
| Fall Time: 78.2 | Fall Time: 75 |
| Strobe: 87.7 | Strobe: 90 |

In Table 3, the tester cycle is 100 ns. The A_NOT_TC timeset specifies a input signal INPUTA, an output signal OUTPUTA, and a bi-directional signal BIDIRA. Each signal has a specified waveform format that is asserted in each 100 ns tester cycle according to the signal's transition times and state data value (specified in the simulation output file or the generic test vector file). In the example of Table 3, signal INPUTA has a waveform format of "RZ". If the data associated with signal INPUTA at a particular cycle equals '0', then the tester will provide a signal at circuit input INPUTA that starts at zero at the beginning of the cycle and remains at zero for the duration of the cycle. Alternatively, if the data associated with signal INPUTA at a particular cycle equals '1', then the tester will provide a signal at IC input INPUTA that starts at zero at the beginning of the cycle, that transitions to '1' at 11.82 ns into the cycle and returns to '0' at 57.66 ns into the cycle, and that remains at zero for the remainder of the cycle. See FIG. 4 for a more detailed illustration regarding the combination of waveform formats with state data values, transition times, and tester cycles to produce input signals on an ATE system (i.e., as ATE patterns).

As illustrated in Table 3, the design-specific signal timing data file 214 can include multiple time set groups. In the example of Table 2, a non-tester-compatible time set group and a tester-compatible time set group are shown. Additional time set groups, both non-tester-compatible and tester-compatible, may also be included. One time set, non-tester-compatible time set A_NOT_TC 218, is developed to describe the real time, non-tester-compatible timings used in the simulation. (Assume, in the example of Table 2, that the targeted ATE system limits signal transactions to 5 ns boundaries. Therefore, time set A_NOT_TC is non-tester-compatible). Time set 218 is used in verification module 204 (using the command line option "−TCOMP") to generate non-tester-compatible test vectors 212. A second time set, tester-compatible time set A_TC 220, is partnered with time set A_NOT_TC (as suggested by dotted line 216) and contains tester-compatible time sets having signal transitions occurring at not less than 5 ns intervals. Table 3 shows the "Partner" field, which indicates the partner of a particular time set, if it exists. Time set 220 is developed by the designer to comply with the timing and waveform format limitations of a particular ATE system and is used in translation module 210 (using the command line option ("+TCOMP") to generate tester-compatible input stimulus 222.

Tester-compatible input stimulus 222 is input into simulation module 224, which can be the same simulator as used in 203 or a different type of simulator (e.g., simulation module 213 could be an RTL simulator and simulation module 224 could be a gate-level simulator). Simulation module 224 generates simulation output data 226, which is tester-compatible by nature of its tester-compatible input stimulus 222. Verification module 228 (receiving the "+TCOMP" command line option) uses tester-compatible time set A_TC to generate tester compatible generic test vectors 234. If verification module 228 determines that the results of the simulation do not match the expected result (as tested in decision block 230), the designer modifies the design, the input stimulus, or the expected results in block 232 and loops back to re-simulate the circuit using the tester-compatible input stimulus. This re-simulation loop continues until the simulation produces correct results (and tester-compatible generic test vectors 234) with tester-compatible input stimulus. Verification module 228 also generates tester-compatible generic test vector file 234, which generation module 236 converts into tester-compatible ATE patterns 238.

Figure 3A:
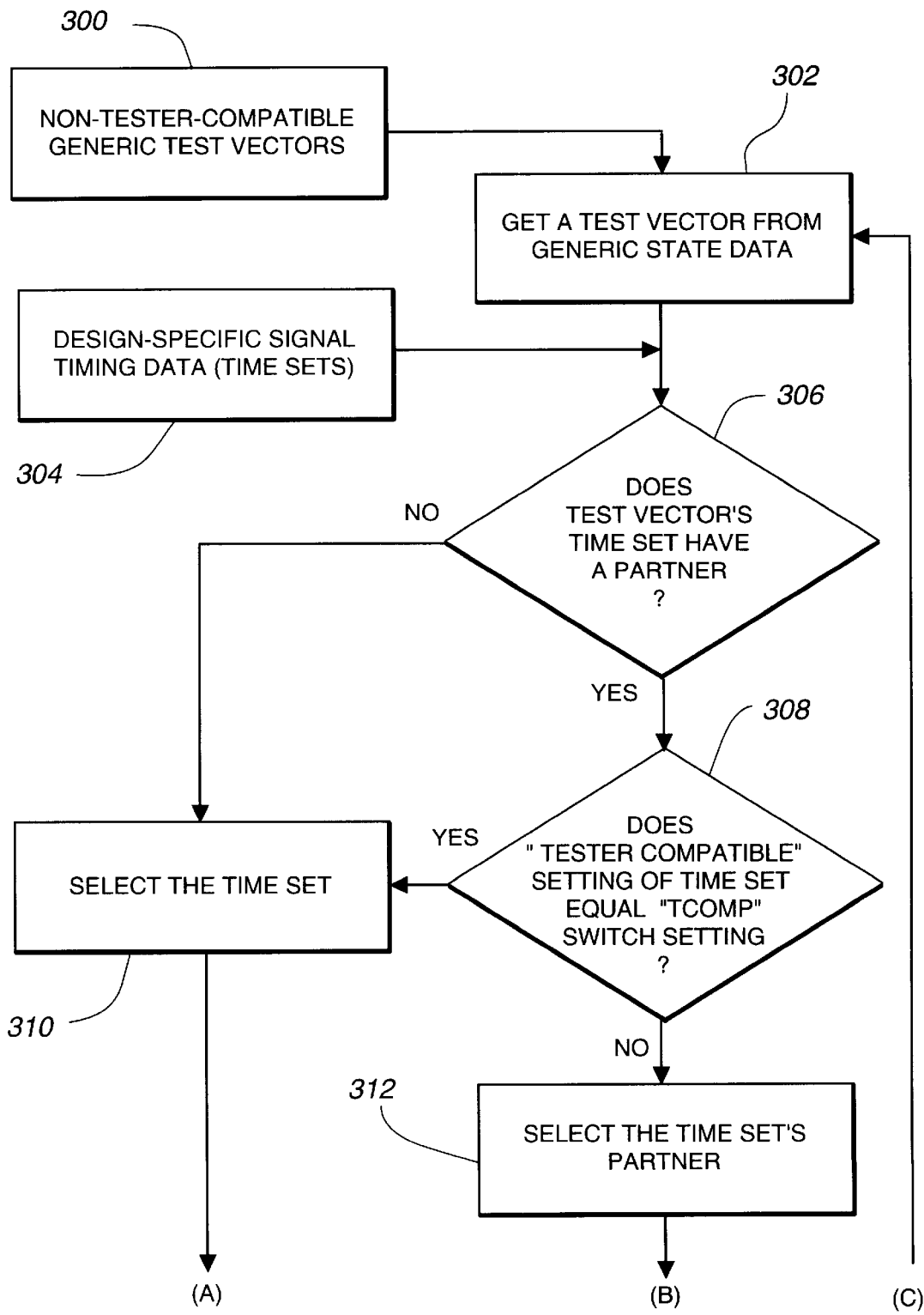
FIGS. 3A and 3B depict a block diagram of a process for translating a non-tester-compatible generic test vector file to a tester-compatible input stimulus file.
Figure 3B:
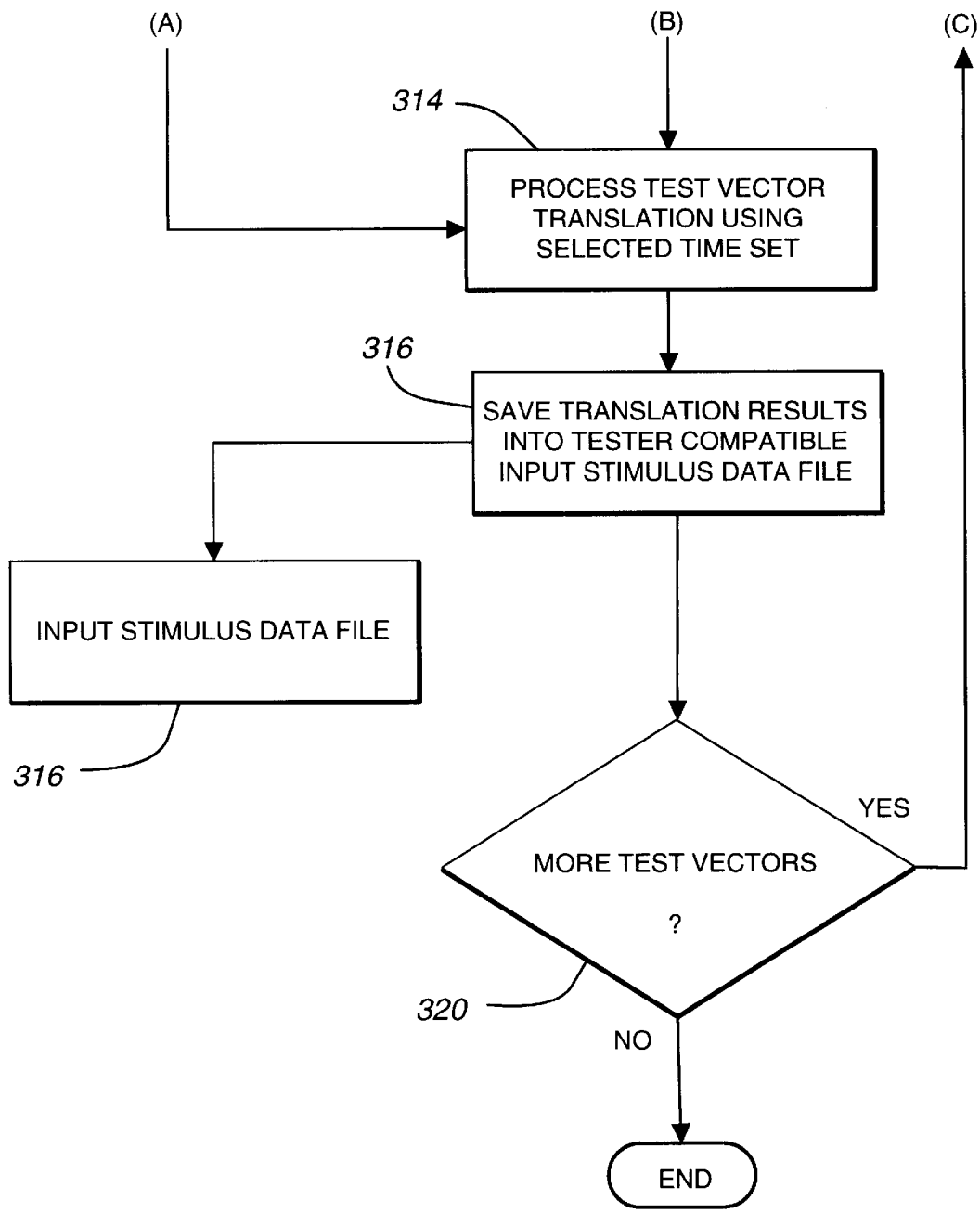

FIGS. 3A and 3B depict a block diagram of translation module 210 in FIG. 2 for translating a non-tester-compatible generic test vector file to a tester-compatible input stimulus file. Non-tester-compatible generic test vectors 300 are input to module 302, which reads a test vector and corresponding time set indicator for a cycle. Decision block 306 looks up the corresponding time set indicator in design-specific signal timing data 304 and tests whether the corresponding time set has a partner. If the corresponding time set has no partner, the corresponding time set indicator is selected (in block 310) for use by translation block 314 in generating tester-compatible input stimulus file 316. Otherwise, decision block 308 tests whether the "Tester Compatible" setting in the corresponding time set equals the "±TCOMP" option set in the translation module (i.e., whether the corresponding time set's "Tester Compatible" setting satisfies the TCOMP setting). If the setting does not match the "±TCOMP" option, the partner time set of the corresponding time set is selected (in block 312) for use by translation module 314 in generating the tester-compatible input stimulus. Block 320 saves the translation results into tester-compatible input stimulus 316. Otherwise, processing proceeds to block 310 where the corresponding time set is selected for use by translation module 314 in generating the tester-compatible input stimulus in file 316. Block 320 directs processing to block 302 if more test vectors are available for translation.

FIG. 4 depicts examples of combining waveform formats and transition times with tester cycles and signal state data values to produce a tester input signal. State values are stored in a simulation output file for use by a verification module or in a generic test vector file for use by a translation module. The test set is stored in the design-specific signal timing database provided by the designer. To generate a generic test vector entry for a particular signal, a verification module utilizes the waveform format and transition time information to extract the state value occurring at a particular time, thereby converting the print-on-change file data (having entries only when a signal changes) into complete test vector data for every tester cycle and all signals. Likewise, to generate input stimulus from a generic test vector file and test set data, a translation module applies the waveform format and transition time(s) to a generic state value listed for a specific tester cycle. The result of the translation is an input stimulus file. Because the test set applied to the state data during a verification or a translation can be easily selected and translated because of time set partnering, state data can be conveniently mapped back and forth between tester-compatible and non-tester compatible time sets. This flexible approach provides the capability of simulating and re-simulating real world and ATE-compatible input stimulus to obtain the optimal ATE test patterns.

While the method disclosed herein has been described and shown with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

Moreover, while there have been described herein the principles of the present invention in conjunction with specific system and method implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein.

Although claims have been formulated in this application to particular combinations of features, it should be understood that the scope of the disclosure herein also includes any novel feature or any novel combination of features disclosed either explicitly or implicitly for any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived thereof.

What is claimed is:

1. A method for generating tester-compatible simulation output data for use in testing a circuit in an automated test system, said circuit being represented by a design representation, said method comprising the steps of:

generating non-tester-compatible simulation output data by simulating said design representation in a simulator using non-tester-compatible input stimulus;

generating non-tester-compatible generic test vectors from said non-tester-compatible simulation output data;

translating said non-tester-compatible generic test vectors into tester-compatible input stimulus; and generating tester-compatible simulation output data by simulating said design representation in said simulator using said tester-compatible input stimulus.

2. The method of claim 1 wherein the step of generating said non-tester compatible generic test vectors comprises the step of generating cycle-based state data for at least one input signal using non-tester-compatible time set data, said non-tester-compatible time set data including at least one signal transition time value and a waveform format value.

3. The method of claim 1 wherein the translating step comprises the step of generating said tester-compatible input stimulus for at least one input signal using tester-compatible time set data, said tester-compatible time set data including at least one signal transition time value and a waveform format.

4. The method of claim 1 wherein the step of generating non-tester-compatible generic test vectors from said non-tester-compatible simulation output data comprises the step of generating a state table representing a state of said at least one input signal in each of at least one tester cycle.

5. A method for generating tester-compatible test patterns for testing a circuit in an automated test system, said circuit being represented by a design representation, said method comprising the steps of:

generating non-tester-compatible simulation output data by simulating said design representation in a simulator using non-tester-compatible input stimulus;

generating non-tester-compatible generic test vectors from said non-tester-compatible simulation output data;

translating said non-tester-compatible generic test vectors into tester-compatible input stimulus;

generating tester-compatible simulation output data by simulating said design representation in said simulator using said tester-compatible input stimulus;

generating tester-compatible generic test vectors from said tester-compatible simulation output file; and generating said tester-compatible test patterns from said tester-compatible generic test vectors.

6. The method of claim 5 wherein the step of generating tester-compatible generic test vectors comprises the step of generating cycle-based state data for at least one input signal using tester-compatible time set data, said tester-compatible time set data including at least one signal transition time value and a waveform format value.

7. The method of claim 5 wherein said step of generating tester-compatible generic test vectors from said tester-compatible simulation output data comprises the step of generating a state table representing a state of at least one input signal in each of at least one tester cycle.

8. A method for extracting a tester-compatible input stimulus data element from a non-tester-compatible generic test vector and a tester-compatible time set data element, said non-tester-compatible generic test vector having a state data element being generated from non-tester-compatible time set data element and non-tester-compatible simulation output data element, said method comprising the steps of:

partnering said non-tester-compatible time set data element with a tester-compatible time set data element;

selecting said state data element of said non-tester-compatible generic test vector that corresponds to said non-tester-compatible time set data element;

selecting said tester-compatible time set data element that is partnered to said non-tester-compatible time set element, said selected non-tester-compatible time set element having at least one signal transition time value and a waveform format value; and generating said tester-compatible input stimulus data element by mapping said at least one signal transition time value and said waveform format value according to said selected state element into a tester-compatible input stimulus database.

9. A system for generating tester-compatible simulation output data for use in testing a circuit in an automated test system, said circuit being represented by a design representation, said system comprising:

means for generating non-tester-compatible simulation output data by simulating said design representation in a simulator using non-tester-compatible input stimulus;

means for generating non-tester-compatible generic test vectors from said non-tester-compatible simulation output data;

means for translating said non-tester-compatible generic test vectors into tester-compatible input stimulus; and means for generating tester-compatible simulation output data by simulating said design representation in said simulator using said tester-compatible input stimulus.

10. A system for extracting a tester-compatible input stimulus data element from a non-tester-compatible generic test vector and a tester-compatible time set data element, said non-tester-compatible generic test vector having a state data element being generated from non-tester-compatible time set data element and non-tester-compatible simulation output data element, said system comprising:

means for partnering said non-tester-compatible time set data element with a tester-compatible time set data element;

means for selecting said state data element of said non-tester-compatible generic test vector that corresponds to said non-tester-compatible time set data element;

means for selecting said tester-compatible time set data element that corresponds to said non-tester-compatible time set element, said selected non-tester-compatible time set element having at least one signal transition time value and a waveform format value; and means for generating said tester-compatible input stimulus data element by mapping said at least one signal transition time value and said waveform format value according to said selected state element into a tester-compatible input stimulus database.

11. A program storage media, readable by a computer, tangibly embodying a program of instructions executable by said computer for extracting a tester-compatible input stimulus data element from a non-tester-compatible generic test vector and a tester-compatible time set data element, said non-tester-compatible generic test vector having a state data element being generated from non-tester-compatible time set data element and non-tester-compatible simulation output data element, the program comprising instructions for:

selecting said state data element of said non-tester-compatible generic test vector that corresponds to said non-tester-compatible time set data element;

selecting a tester-compatible time set data element that is partnered with said non-tester-compatible time set data element, said selected non-tester-compatible time set element having at least one signal transition time value and a waveform format value; and generating said tester-compatible input stimulus data element by mapping said at least one signal transition time value and said waveform format value according to said selected state element into a tester-compatible input stimulus database.

* * * * *